United States Patent
Kang et al.

(10) Patent No.: US 7,701,751 B2
(45) Date of Patent: Apr. 20, 2010

(54) ONE-TRANSISTOR TYPE DRAM

(75) Inventors: Hee Bok Kang, Cheongju-si (KR); Suk Kyoung Hong, Gwacheon-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 76 days.

(21) Appl. No.: 12/000,393

(22) Filed: Dec. 12, 2007

(65) Prior Publication Data

US 2009/0010055 A1    Jan. 8, 2009

(30) Foreign Application Priority Data

Jul. 4, 2007    (KR) .................... 10-2007-0067035

(51) Int. Cl.
*G11C 11/24* (2006.01)
(52) U.S. Cl. .............. 365/149; 365/189.15; 365/189.16
(58) Field of Classification Search ................. 365/149, 365/189.15, 189.16
See application file for complete search history.

(56) References Cited

U.S. PATENT DOCUMENTS

| | | | |
|---|---|---|---|
| 5,001,669 A | 3/1991 | Cho et al. | |
| 6,111,778 A * | 8/2000 | MacDonald et al. | 365/149 |
| 7,338,862 B2 | 3/2008 | Huo et al. | |
| 2003/0231521 A1* | 12/2003 | Ohsawa | 365/174 |
| 2005/0029551 A1* | 2/2005 | Atwood et al. | 257/208 |
| 2005/0047218 A1* | 3/2005 | Kirihata et al. | 365/189.07 |
| 2007/0023789 A1 | 2/2007 | Hoefler et al. | |
| 2008/0048239 A1 | 2/2008 | Huo et al. | |
| 2008/0137394 A1* | 6/2008 | Shimano et al. | 365/72 |
| 2008/0142868 A1 | 6/2008 | Tak et al. | |

FOREIGN PATENT DOCUMENTS

KR    10-2007-0065033    6/2007

OTHER PUBLICATIONS

S Okhonin, et al. "A SOI Capcitor-less 1T-DRAM Concept," 2001 IEEE International SOI Conference, Oct. 2001, pp. 153-154.

* cited by examiner

*Primary Examiner*—Vu A Le
*Assistant Examiner*—Han Yang
(74) *Attorney, Agent, or Firm*—IP&T Law Firm PLC (57) ABSTRACT

A one-transistor type DRAM comprises a floating body storage element configured to store data in a floating body in a SOI wafer, a plurality of access transistors each connected between a bit line and one end of the floating body storage element, a word line configured to control the floating body storage element, and a plurality of port word lines each configured to select one of the plurality of access transistors.

9 Claims, 9 Drawing Sheets

DATA "1" STORAGE STATE

Fig.3a

DATA "0" STORAGE STATE

ONE-TRANSISTOR TYPE DRAM

CROSS-REFERENCES TO RELATED APPLICATIONS

This application is based upon and claims the benefit of priority to Korean Patent Application No. 10-2007-0067035, filed on Jul. 4, 2007, the entire contents of which are incorporated herein by reference.

TECHNICAL FIELD

The embodiments generally relate to a one-transistor type DRAM, and more specifically, to a technology of obtaining a multi-port DRAM cell using a floating body storage element.

BACKGROUND

Generally, a semiconductor device such as a DRAM is integrated over a silicon wafer. However, in the silicon wafer used in the semiconductor device, the whole silicon is not used in the operation of the device, rather a limited thickness of the device, e.g. several μm from the surface, is used. As a result, the rest of the silicon wafer, except a portion required in the operation of the device, increases power consumption and degrades driving speed.

A Silicon On Insulator (SOI) wafer has been required which includes an insulating layer in a silicon substrate to obtain a silicon single crystal layer having thickness of several μm. In a semiconductor device integrated in the SOI wafer, a smaller junction capacity facilitates high speed operation in comparison with a semiconductor device integrated in a general silicon wafer, and a low voltage due to a low threshold satisfies high speed operation and low voltage.

SUMMARY

Disclosed is a multi-port DRAM cell using a floating body storage element in a one-transistor type DRAM to improve a data access speed. Various embodiments are directed at facilitating an individual read/write operation of each port in a one-transistor type DRAM using a plurality of port.

According to one embodiment, an individual refresh operation of each port in a one-transistor type DRAM is facilitated by using a plurality of ports.

According to another embodiment, a multi-port cell comprises using a one-transistor type floating body storage element by a simple process which does not include a capacitor process.

According to yet another embodiment, there is provided a multi-port cell using a one-transistor type floating body storage element to reduce a cell area without a large-sized capacitor.

According to another embodiment, a one-transistor type DRAM comprises a floating body storage element configured to store data in a floating body in a SOI wafer, a plurality of access transistors each connected between a bit line and one end of the floating body storage element, a word line configured to control the floating body storage element, and a plurality of port word lines each configured to select one of the plurality of access transistors.

According to a further embodiment, a one-transistor type DRAM comprises a plurality of multi-port word lines arranged in a row direction, a plurality of multi-port bit lines arranged in a column direction, and a plurality of unit cells located in a region where the plurality of multi-port word lines are crossed with the plurality of multi-port bit lines.

Each of the plurality of unit cells comprises a floating body storage element configured to store data in a floating body in a SOI wafer, a plurality of access transistors connected between one end of the floating body storage element and the multi-port bit line and controlled by the multi-port word line, and a word line configured to control the floating body storage element.

DETAILED DESCRIPTION

Figure 1:
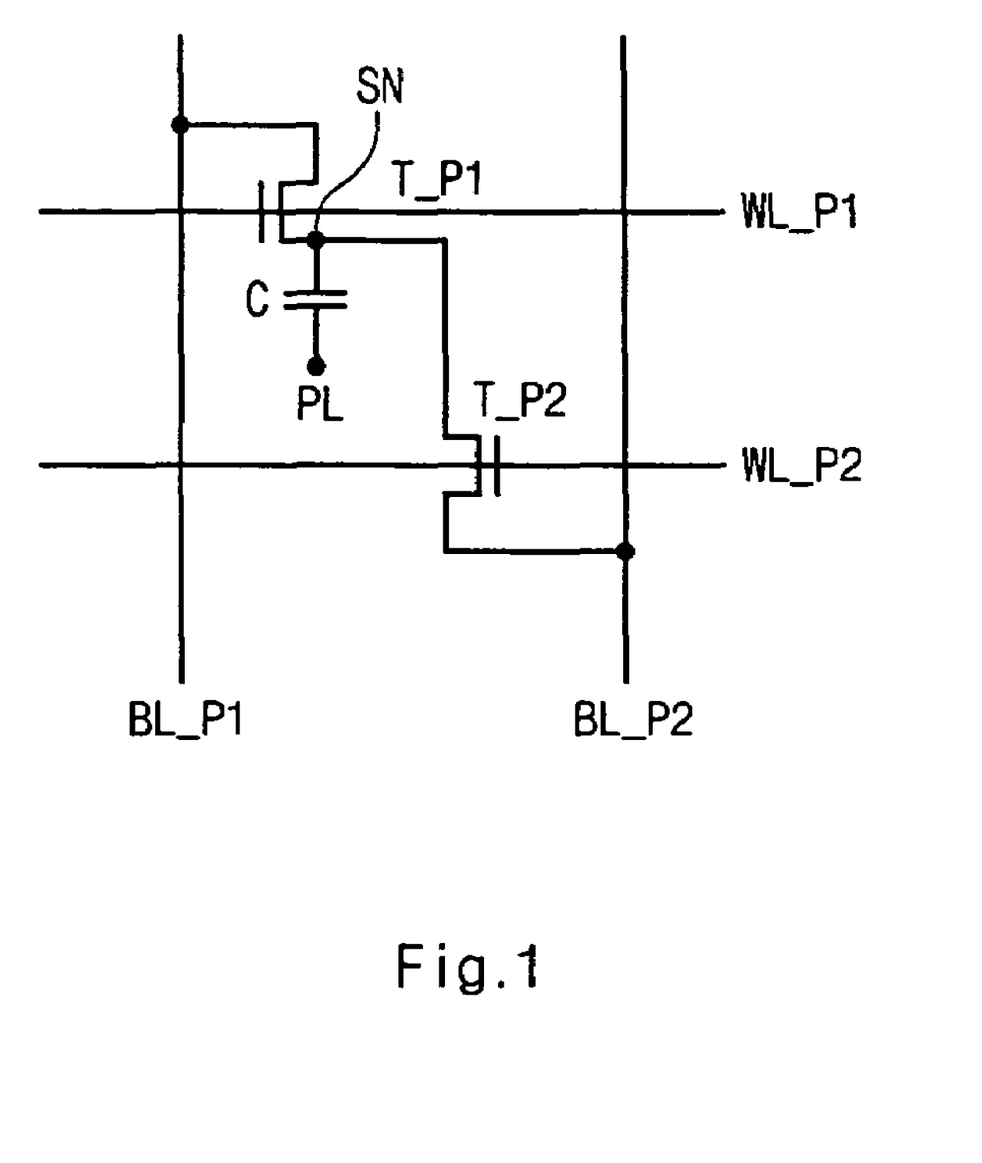
FIG. 1 is a circuit diagram illustrating a conventional 2T1C DRAM as a dual port.

FIG. 1 is a circuit diagram illustrating a conventional 2T1C DRAM as a dual port. A conventional DRAM cell includes two access transistors T_P1, T_P2 controlled by two word lines WL_P1, WL_P2, and a capacitor C. The access transistors T_P1, T_P2 are, MOS transistors.

Each drain terminal of the access transistors T_P1, T_P2 is connected to two bit lines BL_P1, BL_P2. Each source terminal of the access transistors T_P1, T_P2 is connected to one electrode of the capacitor C, that is, a storage node SN. In the storage node SN, written charges are stored.

The other electrode of the capacitor C is connected to a common cell plate line PL to receive a cell plate voltage VCP. The cell plate voltage VCP is defined by a half power voltage VDD. The power voltage VDD is defined by a high operation voltage of the cell.

The word line WL_P1 is connected to a first port, and the word line WL_P2 is connected to a second port. The bit line BL_P1 is connected to the first port, and the bit line BL_P2 is connected to the second port.

The improvement of system performance requires development of access performance of the memory cell. However, a conventional memory cell including only one port cannot perform a plurality of read/write operations at the same time.

The conventional 2T1C DRAM cell includes a multi-port to perform a plurality of operations at the same time. The multi port cell stores data by a charge sharing method with a capacitor node, so that there is a limit in an operation speed of data access. In order to obtain a capacitor, a capacitor process is performed so that the process becomes complicated. Also, a large-sized capacitor enlarges the whole cell size.

Figure 2:
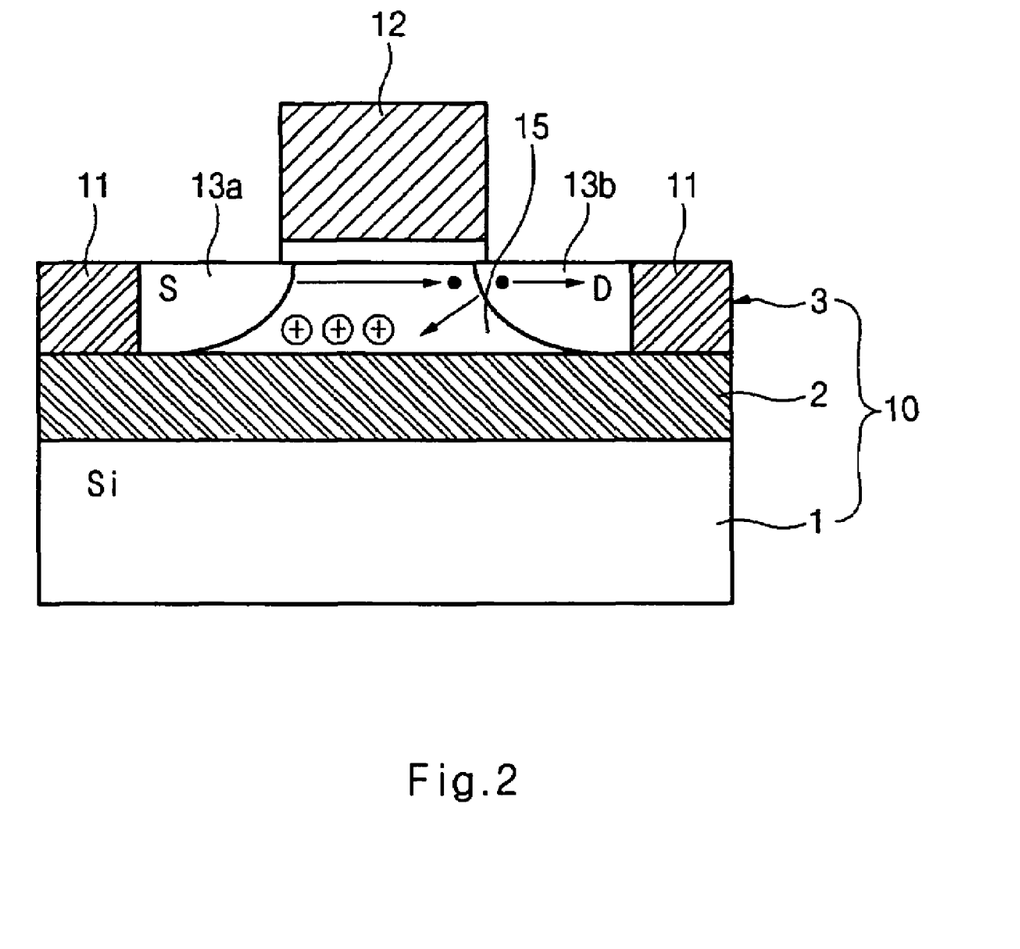
FIG. 2 is a cross-sectional diagram illustrating a unit cell of a one-transistor type DRAM consistent with the invention.

FIG. 2 is a cross-sectional diagram illustrating a unit cell of a one-transistor type DRAM according to an embodiment of the invention. A silicon on insulator (SOI) wafer 10 includes a stacked structure including a silicon substrate 1, a buried oxide layer 2 and a silicon layer 3. A device isolation film 11 that defines an active region in the silicon layer 3 of the SOI wafer 10 is formed to contact with the buried oxide layer 2. A gate 12 is formed over the active region of the silicon layer 3. Source/drain regions 13a and 13b are formed to contact with the buried oxide film 2 in the silicon layer 3 located at both sides of the gate 12. A DRAM cell of the SOI wafer 10 captures holes and electrons in a floating body 15 corresponding to a channel region under the gate 12 to store data.

Figure 3A:
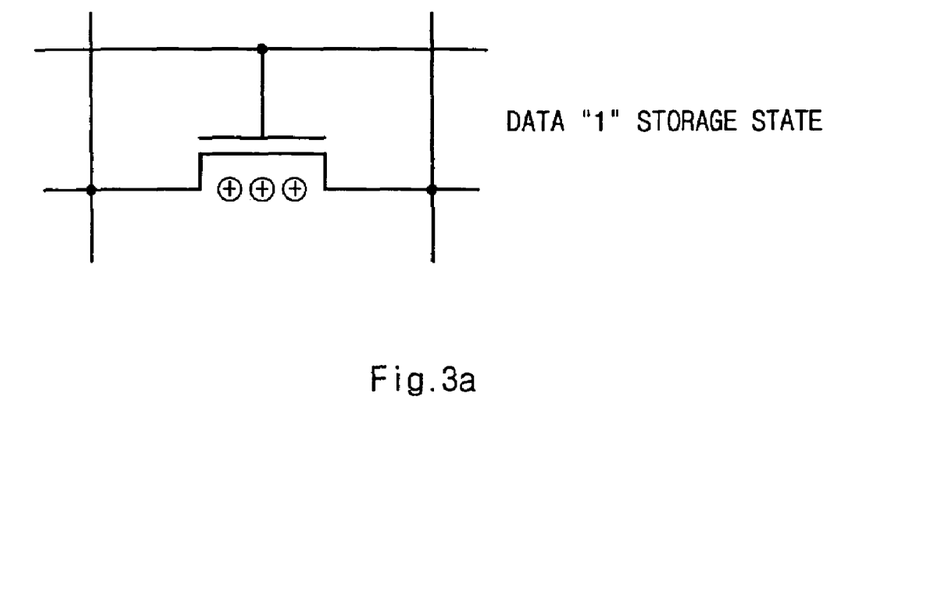
FIGS. 3a and 3b are diagrams illustrating a cell data storage state of a one-transistor type DRAM consistent with the invention.
Figure 3B:
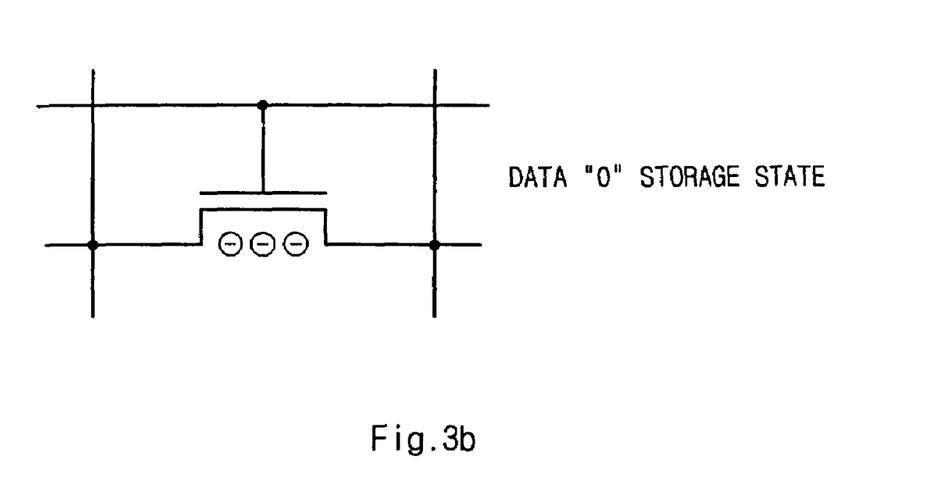

As shown in FIG. 3a, the data "1" storage state means that there are many holes in the floating body 15 (FIG. 2). As shown in FIG. 3b, the data "0" storage state means that there is a small number of holes or the large number of electrons in the floating body 15.

In a one-transistor type DRAM according to an embodiment of the invention, the source 13a is connected to a source line SL and the drain 13b is connected to the bit line BL. A word line is connected to the gate 12.

In order to store data "1" in the floating body 15, while the word line WL maintains an operating voltage VDD and the source line SL maintains a ground voltage GND, a bit line write voltage Vwt1 is applied to the bit line BL. As a result, a data "1" write current flows from the bit line BL into the source line SL.

A large amount of holes is generated, and captured in the floating body 15. A voltage by the captured holes becomes lower than the bit line write voltage Vwt1. A hole having a high voltage level is stored in the floating body 15.

In order to store data "0" in the floating body 15, while the word line WL maintains the operating voltage VDD and the source line SL maintains the ground voltage GND, a bit line write voltage Vwt0 is applied to the bit line BL. As a result, a data "0" write current flows from the bit line BL into the source line SL.

The bit line write voltage Vwt0 is smaller than the bit line write voltage Vwt1 to generate a small amount of holes which are captured in the floating body 15. A voltage by the captured holes becomes lower than the bit line write voltage Vwt0. As a result, a hole having a low voltage level is stored in the floating body 15.

Figure 4:
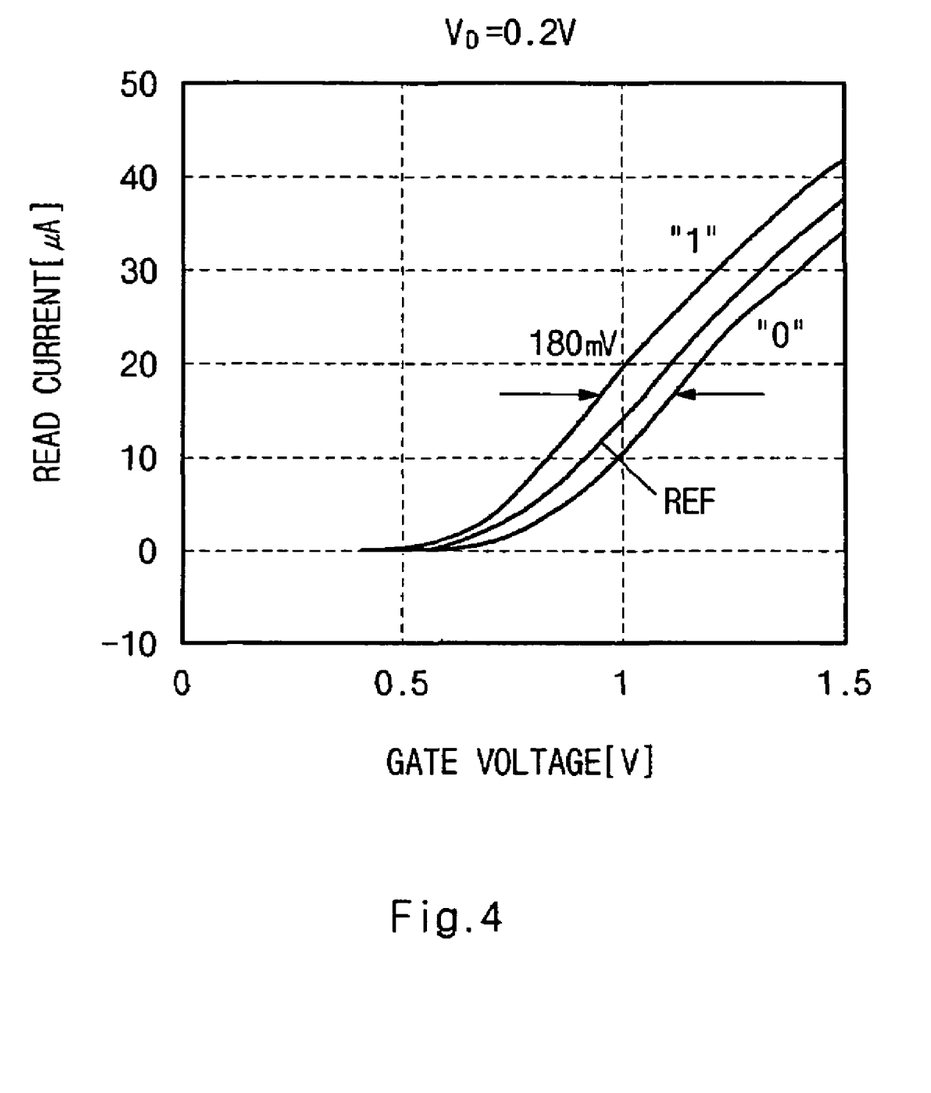
FIG. 4 is a waveform diagram illustrating a characteristic of a cell read current of a one-transistor type DRAM consistent with the invention.

FIG. 4 is a waveform diagram illustrating a characteristic of a cell read current of a one-transistor type DRAM according to an embodiment of the invention. The graph of FIG. 4 illustrates a cell read current when a cell gate voltage is swept while a cell drain voltage Vd is 0.2V, a cell source voltage is grounded in a DRAM cell of the SOI wafer 10.

When a word line read voltage is applied to the word line WL, a read current flows from the bit line BL into the source line SL. The data "1" is read when the amount of flowing sensing current is larger than a reference current, and the data "0" is read when it is smaller than the reference current.

At the read mode of the one-transistor type cell, a larger amount of sensing current flows in the data "1" storage state than in the data "0" storage state. That is, the data "1" storage state has the largest amount of read current, and the data "0" storage state has the smallest amount of read current. The reference current REF has a read current value corresponding to a middle value between the data "1" storage state and the data "0" storage state.

Figure 5:
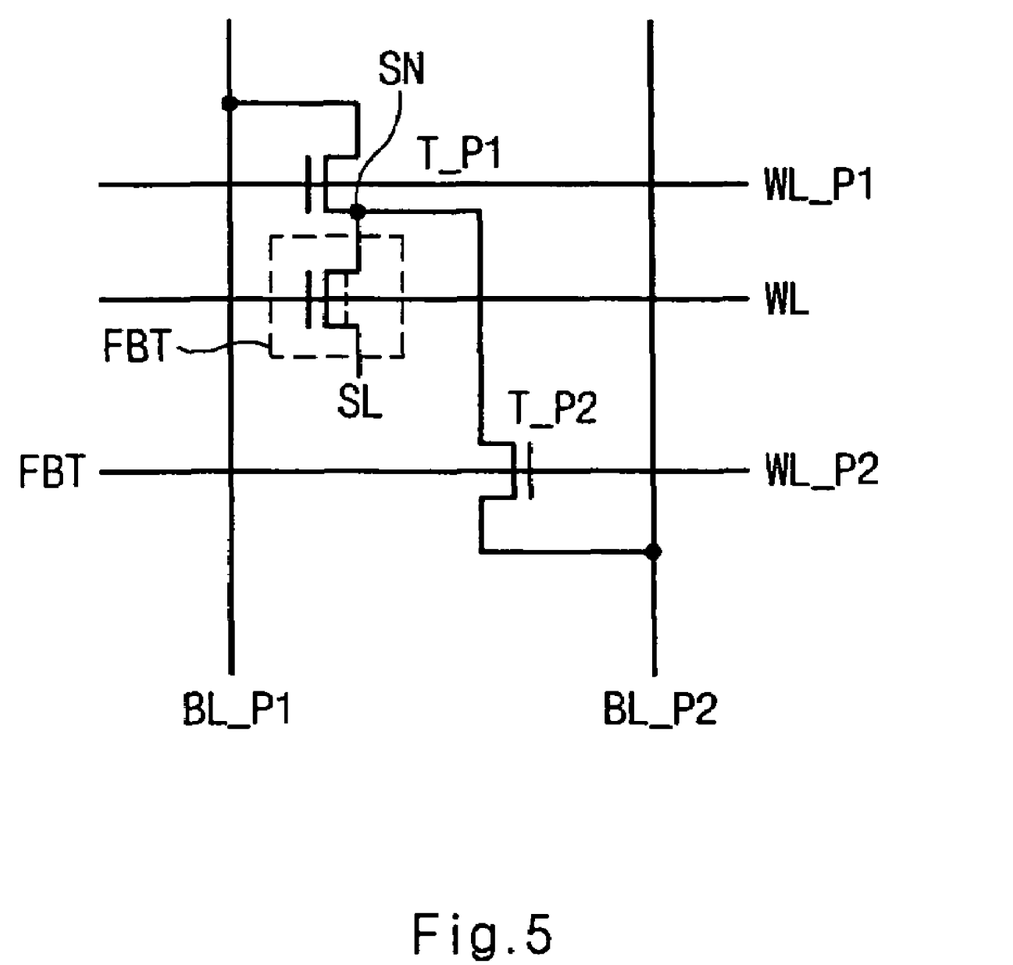
FIG. 5 is a circuit diagram illustrating a one-transistor type DRAM as a dual port consistent with the invention.

FIG. 5 is a circuit diagram illustrating a one-transistor type DRAM as a dual port according to an embodiment consistent with the invention. The one-transistor type DRAM has a three transistor structure including two access transistors T_P1, T_P2 regulated by word lines WL_P1, WL_P2 and a one-T type floating body transistor FBT. Each of the access transistors T_P1, T_P2 as a selective switching element for selecting a port has a MOS transistor structure.

Drain terminals of the access transistors T_P1, T_P2 are connected to bit lines BL_P1, BL_P2. Source terminals of the access transistors T_P1, T_P2 are connected to one electrode of the floating body transistor FBT, that is, a storage node SN. In the storage node SN, written charges are stored.

The other electrode of the floating body transistor FBT is connected to the source line SL. The floating body transistor FBT is controlled by the word line WL. The source line SL of the floating body transistor FBT represents the source 13a region of FIG. 2, and a given bias voltage is applied for read/write operations of data.

A word line WL_P1 is connected to a first port, and a word line WL_P2 is connected to a second port. The bit line BL_P1 is connected to the first port, and the bit line BL_P2 is connected to the second port.

Figure 6:
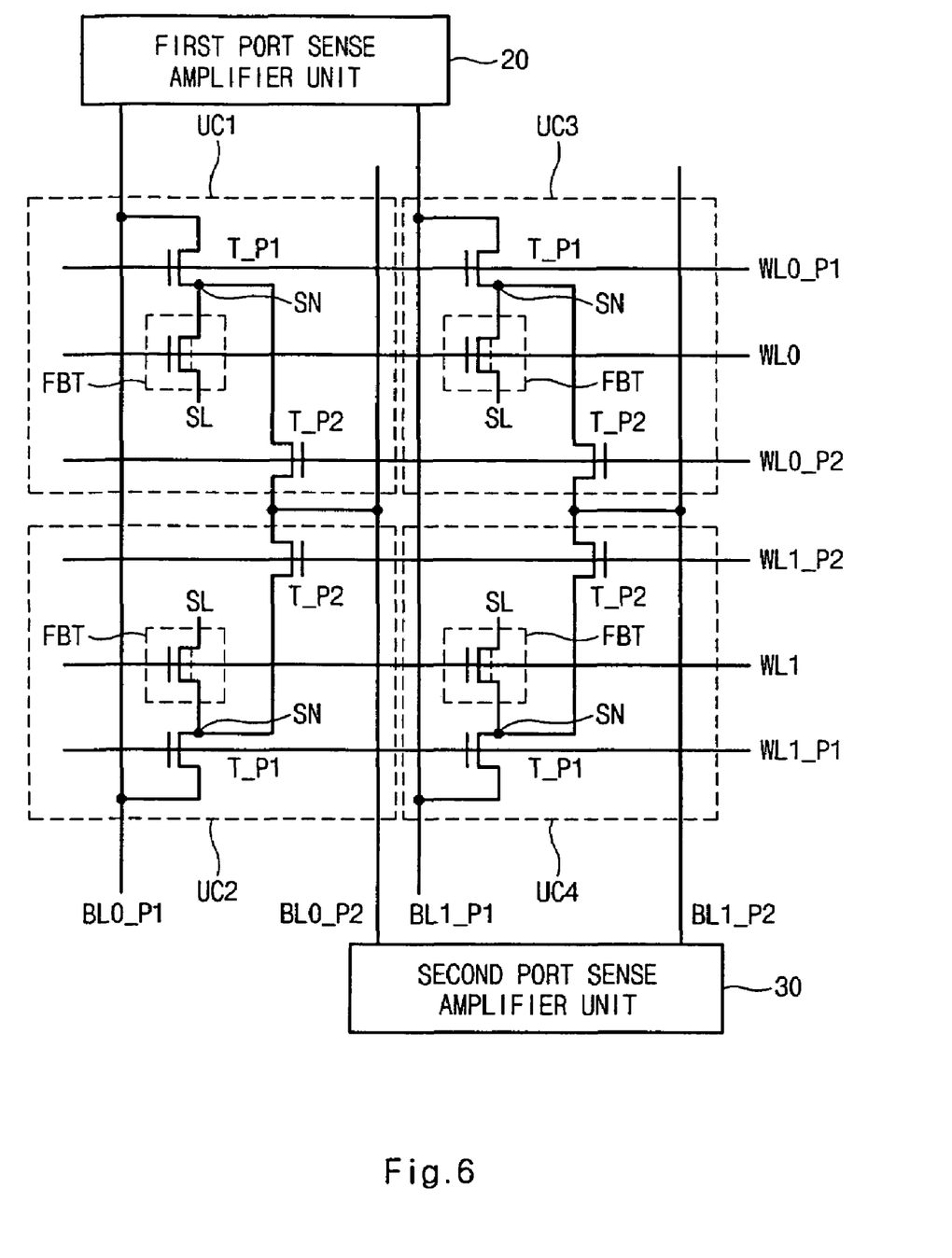
FIG. 6 is a circuit diagram illustrating a one-transistor type DRAM as a dual port cell array consistent with the invention.

FIG. 6 is a circuit diagram illustrating a one-transistor type DRAM as a dual port cell array according to an embodiment of the invention. The cell array includes a plurality of unit cells UC arranged in row and column directions. The unit cell UC includes two access transistors T_P1, T_P2 and a one-T-type floating body transistor FBT.

A plurality of multi port word lines WL0_P1, WL0_P2, WL1_P1, WL1_P2 are arranged in the row direction, and a plurality of multi port bit lines BL0_P1, BL0_P2, BL1_P1, BL1_P2 are arranged in the column direction. A plurality of unit cells UC1~UC4 are located in a region where the multi port word lines WL0_P1, WL0_P2, WL1_P1, WL1_P2 are crossed with the multi port bit lines BL0_P1, BL0_P2, BL1_P1, BL1_P2.

The unit cells UC1, UC2 are connected between the bit line BL0_P1 corresponding to the first port and the bit line BL0_p2 corresponding to the second port. The unit cells UC1, UC2 arranged in top and bottom portions share bit lines in the same port.

The unit cells UC3, UC4 are connected between the bit line BL1_P1 corresponding to the first port and the bit line BL1_p2 corresponding to the second port. The unit cells UC3, UC4 arranged in top and bottom portions share bit lines in the same port.

The bit lines BL0_P1, BL1_P1 of the first port connected to the access transistor T_P1 are connected to a first port sense amplifier unit 20. The bit lines BL0_P2, BL1_P2 of the second port connected to the access transistor T_P2 are connected to a second port sense amplifier unit 30.

Figure 7:
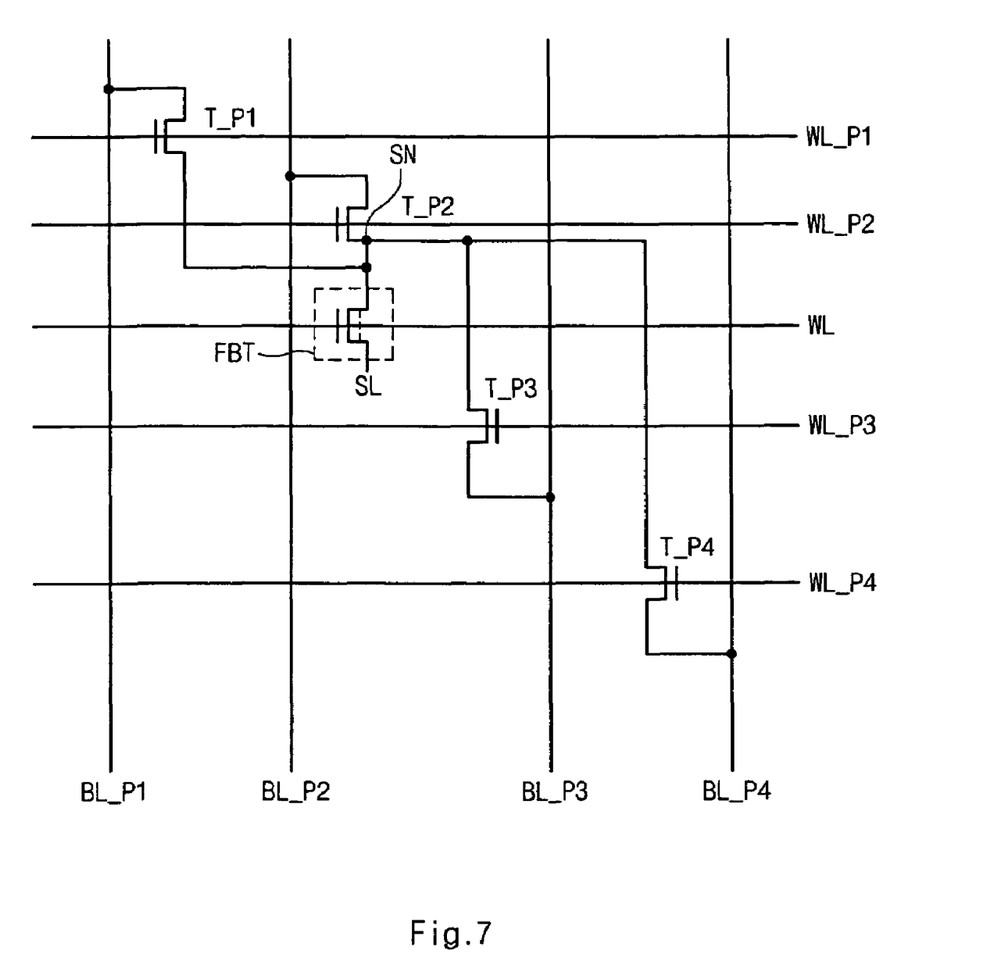
FIG. 7 is a circuit diagram illustrating a one-transistor type DRAM as two or more multi-ports consistent with the invention.

FIG. 7 is a circuit diagram illustrating a one-transistor type DRAM as two or more multi ports according to an embodiment of the present invention. The one-transistor type DRAM includes a plurality of access transistors T_P1~T_P4 controlled by a plurality of word line WL_P1~WL_P4 and a 1-T-type floating body transistor FBT. Each of the access transistors T_P1~T_P4 as a selective switching element for selecting a corresponding port has a MOS transistor structure.

Drain terminals of the access transistors T_P1~T_P4 are connected to the corresponding to the bit lines BL_P1~BL_P4. Source terminals of the access transistors T_P1~T_P4 are connected to one electrode of the floating body transistor FBT, that is, a storage node SN. In the storage node SN, written charges are stored.

The other electrode of the floating body transistor FBT is connected to the source line SL. The floating body transistor FBT is controlled by the word line WL.

The word line WL_P1 is connected to a first port, and the word line WL_P2 is connected to a second port. The word line WL_P3 is connected to a third port, and the word line WL_P4 is connected to a fourth port.

The bit line BL_P1 is connected to the first port, and the bit line BL_P2 is connected to a second port. The bit line BL_P3 is connected to the third port, and the bit line BL_P4 is connected to a fourth port.

The multi port DRAM cell includes the word lines WL and the bit lines BL corresponding to a plurality of ports, and has a 1-T-type floating body storage element FBT. In an embodiment of the present invention, the access transistor T_P is selected by a plurality of word lines WL_P to perform individual read/write operations and refresh operation in each port.

When the word line WL0_P1 corresponding to the first port is activated, the access transistor T_P1 is selected. As a result, data stored in the floating body transistor FBT can be read by the access transistor T_P1.

When the word line WL0_P2 corresponding to the second port is activated, the access transistor T_P2 is selected. As a result, data can be stored in the floating body transistor FBT by the access transistor T_P2.

Although the multi port cell has four ports in the embodiment of the present invention, the multi port cell can be four or more ports. In this case, the multi port cell can include access transistors corresponding to the number of ports.

Figure 8:
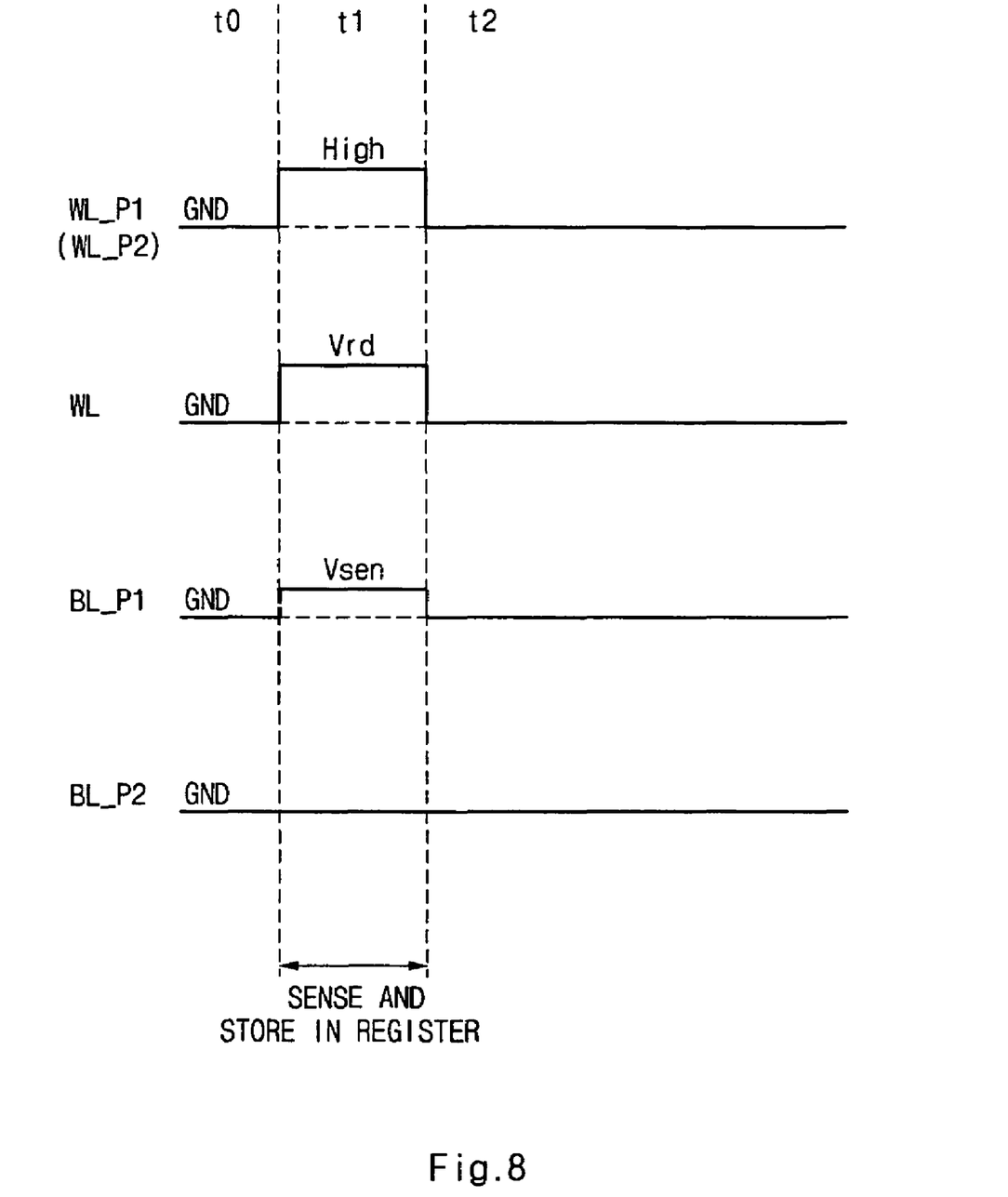
FIG. 8 is a timing diagram illustrating a read operation of a semiconductor memory device consistent with the invention.

FIG. 8 is a timing diagram illustrating a read operation of a semiconductor memory device according to an embodiment of the present invention. FIG. 8 shows when the port word line WL_P1 and the port bit line BL_P1 are selected.

In a period t0, the port word line WL_P1, the word line WL and the port bit line BL_P1 maintain a ground voltage GND level.

In a period t1, the port word line WL_P1 transits from the ground voltage GND level to a high voltage level, and the word line WL transits from the ground voltage GND level to a read voltage Vrd level.

The bit line BL_P1 transits from the ground voltage GND level to a sensing bias voltage Vsen level. The bit line BL_P2 maintains the ground voltage GND level.

The access transistor T_P1 is turned on to sense and amplify a value of a cell sensing current Isen flowing through the bit line BL_P1 in a first port sense amplifier unit S/A, thereby storing the value in a register REG.

In a period t2, the port word line WL_P1 transits from the high level to the ground voltage GND level, and the word line WL transits from the read voltage Vrd to the ground voltage GND level. The bit line BL_P1 transits from the sensing bias voltage Vsen to the ground voltage GND level.

Figure 9:
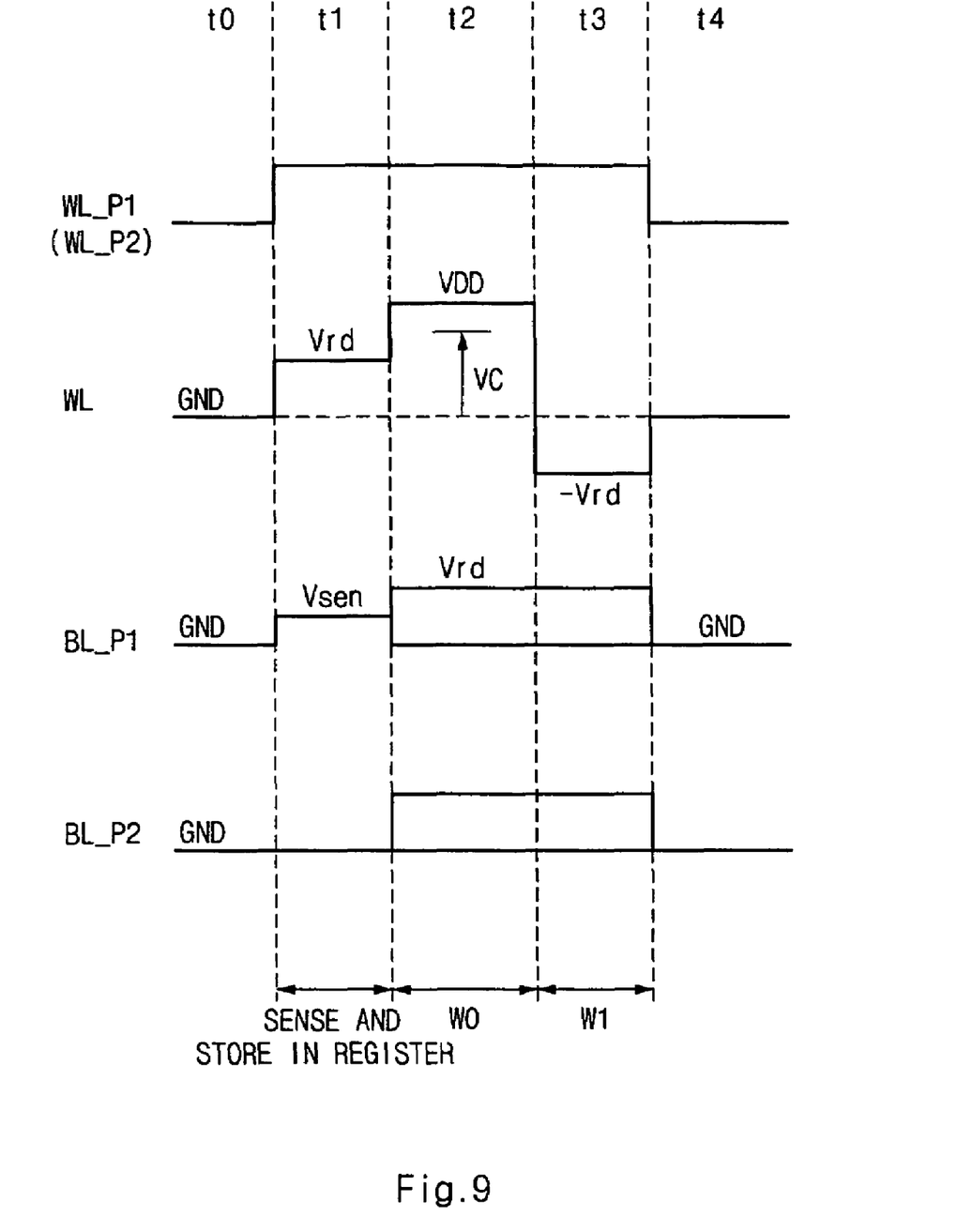
FIG. 9 is a timing diagram illustrating a write operation of a semiconductor memory device consistent with the invention.

FIG. 9 is a timing diagram illustrating a write operation of a semiconductor memory device according to an embodiment of the invention. In a period t0, the port word line WL_P1, the word line WL and the port bit line BL_P1 maintain a ground voltage GND level.

In a period t1, the port word line WL_P1 transits from the ground voltage GND level to a high voltage level, and the word line WL transits from the ground voltage GND level to a read voltage Vrd level.

The bit line BL_P1 transits from the ground voltage GND level to a sensing bias voltage Vsen level. The bit line BL_P2 maintains the ground voltage GND level.

In a period t2, the port word line WL_P1 maintains the high voltage level. The word line WL transits from the read voltage Vrd level to a power voltage VDD level. The read voltage Vrd is smaller than a threshold voltage Vc, and the power voltage VDD is larger than the threshold voltage Vc. The sensing bias voltage Vsen is smaller than the read voltage Vrd.

The bit line BL_P1 transits from the sensing bias voltage Vsen level to the read voltage Vrd or the ground voltage GND level. The bit line BL_P2 maintains the ground voltage GND level or transits to the read voltage Vrd level. As a result, the data "0" can be written in all cells in the row direction.

In a period t3, the port word line WL_P1 maintains the high voltage level. The word line WL transits from the power voltage VDD level to a negative read voltage—Vrd level.

The bit line BL_P1 maintains the read voltage Vrd or the ground voltage GND level. The bit line BL_P2 maintains the ground voltage GND level or transits to the read voltage Vrd level. The data stored in the register REG is written in the memory cell to restore data, or new externally applied data can be written.

The data "0" is written in the period t1, and the data "0" is maintained in the period t3. The data "1" is written.

In a period t4, the port word line WL_P1 transits from the high voltage level to the ground voltage GND level. The word line WL transits from the negative read voltage—Vrd level to the ground voltage GND level. The bit line BL_P1 transits from the read voltage Vrd level to the ground voltage GND level.

The positive read voltage Vrd, the power voltage VDD, the negative read voltage—Vrd and other voltages supplied from the port word line WL_P are supplied from a row decoder. The row decoder is disclosed in Korean Patent Application No. 2007-0065033 filed by the same inventor.

As described above, according to an embodiment of the present invention, a multi-port DRAM cell using a floating body storage element in a one-transistor type DRAM may improve data access speed. In the one-transistor type DRAM, an individual read/write operation of each port can be performed, and an individual refresh operation of each port can be performed.

Also, a multi port cell using a one-transistor type floating body storage element by a simple process does not include a capacitor process. The multi-port cell using a one-transistor type floating body storage element reduces a cell area without a large-sized capacitor.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A one-transistor type DRAM comprising:
   a silicon-on-insulator (SOI) wafer;
   a floating body storage element comprising a storage node and a source line, and configured to store data in the floating body in the SOI wafer;
   a plurality of access transistors each connected between a plurality of bit lines and the storage node;
   a word line configured to control the floating body storage element; and
   a plurality of port word lines each configured to select one of the plurality of access transistors.

2. The one-transistor type DRAM according to claim 1, wherein the plurality of bit lines includes the same number of the plurality of access transistors.

3. The one-transistor type DRAM according to claim 1, wherein the plurality of access transistors comprise:

a first access transistor connected between a first bit line and the storage node, and controlled by a first word port line; and a second access transistor connected between a second bit line and the storage node, and controlled by a second port word line.

4. The one-transistor type DRAM according to claim 1, wherein the plurality of access transistors are connected to different bit lines, and individually operated by the plurality of port word lines.

5. A one-transistor type DRAM comprising:
a plurality of multi-port word lines arranged in a row direction;
a plurality of multi-port bit lines arranged in a column direction; and
a plurality of unit cells located in a region of the DRAM where the plurality of multi-port word lines are crossed with the plurality of multi-port bit lines,
wherein the plurality of unit cells comprise:
a floating body storage element comprising a storage node and a source line, and configured to store data in a floating body in a silicon-on-insulator (SOI) wafer;
a plurality of access transistors connected between the storage node and the multi-port bit line, and controlled by the multi-port word line; and
a word line configured to control the floating body storage element.

6. The one-transistor type DRAM according to claim 5, further comprising a sense amplifier unit configured to sense and amplify data received from the multi-port bit line.

7. The one-transistor type DRAM according to claim 6, wherein one sense amplifier unit is shared by bit lines connected to the same port of the multi-port bit lines.

8. The one-transistor type DRAM according to claim 5, wherein the plurality of multi-port bit lines include the same number of the plurality of access transistors.

9. The one-transistor type DRAM according to claim 5, wherein each of the plurality of access transistors is connected to a different bit line, and individually operated by the plurality of port word lines.

* * * * *